United States Patent [19]

Bill et al.

[11] Patent Number: 5,309,097
[45] Date of Patent: May 3, 1994

[54] VIDEO DISPLAY TERMINAL MAGNETIC FIELD DETECTOR

[75] Inventors: Richard Bill, Allegan, Mich.; Enrique Rodriguez, 3140 44th St., S.E., Kentwood, Mich. 49512

[73] Assignee: Enrique Rodriquez, Grand Rapids, Mich.

[21] Appl. No.: 869,464

[22] Filed: Apr. 15, 1992

[51] Int. Cl.$^5$ .................. G01R 33/02; G01R 29/08; G01R 33/06; G08B 21/00

[52] U.S. Cl. ............................ 324/258; 324/133; 324/251; 324/260; 340/600; 340/815.4

[58] Field of Search .................. 324/67, 72, 95, 127, 324/133, 149, 251, 258, 260, 244; 340/551, 600, 815.28, 815.29, 706; 358/139; 250/250

[56] References Cited

U.S. PATENT DOCUMENTS

| | | |
|---|---|---|
| 3,296,494 | 1/1967 | Stenger, Jr. et al. ........ 324/133 UX |
| 3,309,690 | 3/1967 | Moffitt ............................ 324/133 X |
| 3,418,572 | 12/1968 | Humphreys, Jr. .................... 324/67 |
| 3,639,841 | 2/1972 | Ricahrdson . |
| 3,679,908 | 7/1972 | Mazza ............................ 340/600 X |
| 3,863,149 | 1/1975 | Johnson ........................ 324/133 X |
| 3,927,375 | 12/1975 | Lanoe et al. . |
| 3,987,319 | 10/1976 | Nirschi . |
| 4,032,910 | 6/1977 | Hollway et al. . |
| 4,095,173 | 6/1978 | Darrel ............................ 324/547 X |
| 4,253,092 | 2/1981 | Connah, Jr. . |
| 4,338,595 | 7/1982 | Newman . |
| 4,386,315 | 5/1983 | Young et al. . |
| 4,467,278 | 8/1984 | Toth et al. . |
| 4,475,078 | 10/1984 | Itani ............................... 324/244 X |
| 4,634,969 | 1/1987 | Edlin et al. .................... 324/258 X |
| 4,714,888 | 12/1987 | French et al. ................... 324/67 X |
| 4,714,915 | 12/1987 | Hascal et al. ................... 324/457 X |
| 4,724,390 | 2/1988 | Rauscher et al. ............... 324/258 X |
| 4,954,812 | 9/1990 | Lebron ........................... 324/260 X |
| 5,150,051 | 9/1992 | Friedman et al. ................. 324/258 |
| 5,168,265 | 12/1992 | Aslan ............................ 340/600 |

FOREIGN PATENT DOCUMENTS 2244560 12/1991 United Kingdom ............... 324/260

OTHER PUBLICATIONS

Metz, Reinhard, Build This Magnetic Field Meter, *Radio-Electronics* Apr. 1991, pp. 33-38.

*Primary Examiner*—Gerard R. Strecker
*Attorney, Agent, or Firm*—Price, Heneveld, Cooper, DeWitt & Litton

[57] ABSTRACT

A system for detecting the presence of a magnetic field emanating from a video display terminal (VDT) in which a current induced through a sensing element is first amplified by a high gain amplifier stage having a very broad low band frequency response curve then rectified by a precision rectifier to convert the AC signal induced through the sensing element to DC current. The DC current is used as one input to a comparator, the other input being set by means of a potentiometer to provide flexibility in setting a threshold input voltage differential representative of a harmful magnetic field radiation level. The output of the threshold comparator triggers a driver which is connected to a battery powered solenoid. The solenoid actuates an indicator flag in the presence of a magnetic field which exceeds the threshold magnetic radiation level. To conserve battery energy, the energized solenoid also functions as a relay to break electrical contact between itself and the batteries simultaneously with actuating the flag indicator. An alternative embodiment of the invention replaces the pickup coil of the preferred embodiment with a Hall effect current sensor to sense the strength of the magnetic field.

1 Claim, 3 Drawing Sheets

VIDEO DISPLAY TERMINAL MAGNETIC FIELD DETECTOR

TECHNICAL FIELD

The present invention relates to an apparatus for detecting the presence of a magnetic field of a particular strength and more particularly relates to an apparatus which provides a readily perceptible visual or auditory signal in response to a magnetic field of a particular strength emanating from a visual display terminal.

BACKGROUND ART

Video display terminals (VDTs) used with computers and in television sets give off propagating electromagnetic radiation composed of electric and magnetic components and an associated static electric field. Recently, the magnetic field component of this electromagnetic radiation has become the cause of public concern resulting in governmental regulation as to acceptable levels. Although others in the past have attempted to provide electromagnetic radiation detectors which measured harmful levels of energy emanating from microwave ovens and other high-power microwave devices used in domestic, industrial, medical and military applications, none of these prior devices are adapted to measure the extremely low frequency (ELF ranging from 5 to 2000 hertz) and very low frequency (VLF ranging from 2000 to 400,000 hertz) magnetic radiation which emanates from video display terminals.

Thus, an urgent need exists for a simple reliable device which can be attached to a video display terminal to warn people who work or live near video display terminals that a particular terminal emits a harmful level of low frequency magnetic radiation. Such a device should provide a low cost but foolproof method which is readily usable by lay persons to determine whether low frequency magnetic radiation leakage from a video display terminal exceeds the level proscribed by governmental standards.

It is a principal object of the present invention to provide a low cost device which is easily utilized by lay persons and is adapted to measure ELF and VLF magnetic radiation levels.

Another object of the present invention is to provide a a device adapted to indicate whether the level of magnetic radiation leakage from a video display terminal exceeds governmental standards.

SUMMARY OF THE INVENTION

In the present invention, a threshold value for magnetic field detection is set by adjusting a potentiometer. The presence of a magnetic field induces a current in a pickup coil which is first amplified by an operational amplibier then rectified by a second operational amplifier. The output of the second operational amplifier is utilized as an input value to a third operational amplifier which compares this value to the threshold level set by means of the potentiometer. When the output value of the second operational amplifier reaches the level set by means of the potentiometer, the third operational amplifier produces output current which is used to trigger a fourth operational amplifier, a driver which actuates an electromechanical relay powered by batteries.

Thus according to one aspect of the present invention, an apparatus is described for indicating the presence of a magnetic field including a sensing means for sensing a magnetic field and generating an electric current in response to the magnetic field, an amplifying means for amplifying the current, a rectifying means for producing a unidirectional direct current, an adjustment means for setting a threshold current level which corresponds to a particular magnetic field strength, a comparing means for comparing the current level to the threshold level, an indicator means for indicating the presence of a magnetic field of a particular threshold level, and a switch driving means connected between the indicator means and the comparator means for transmitting the output of the comparator means to actuate the indicator means.

According to another aspect of the present invention, an apparatus is described for indicating to a user the strength of a magnetic field including a means for sensing the strength of a magnetic field by inducing a current, a means for amplifying said induced current, a means for comparing the induced current to a predetermined threshold value, and a means coupled to the comparing means for indicating to the user that the induced current exceeds the threshold level.

The VDT Magnetic Field Detector is immediately applicable to detection of low frequency magnetic fields of a particular strength. Other objects, features and advantages will be apparent from the following description of a preferred embodiment of the present invention.

DETAILED DESCRIPTION OF THE PREFERRED EMBODIMENTS

Figure 1:
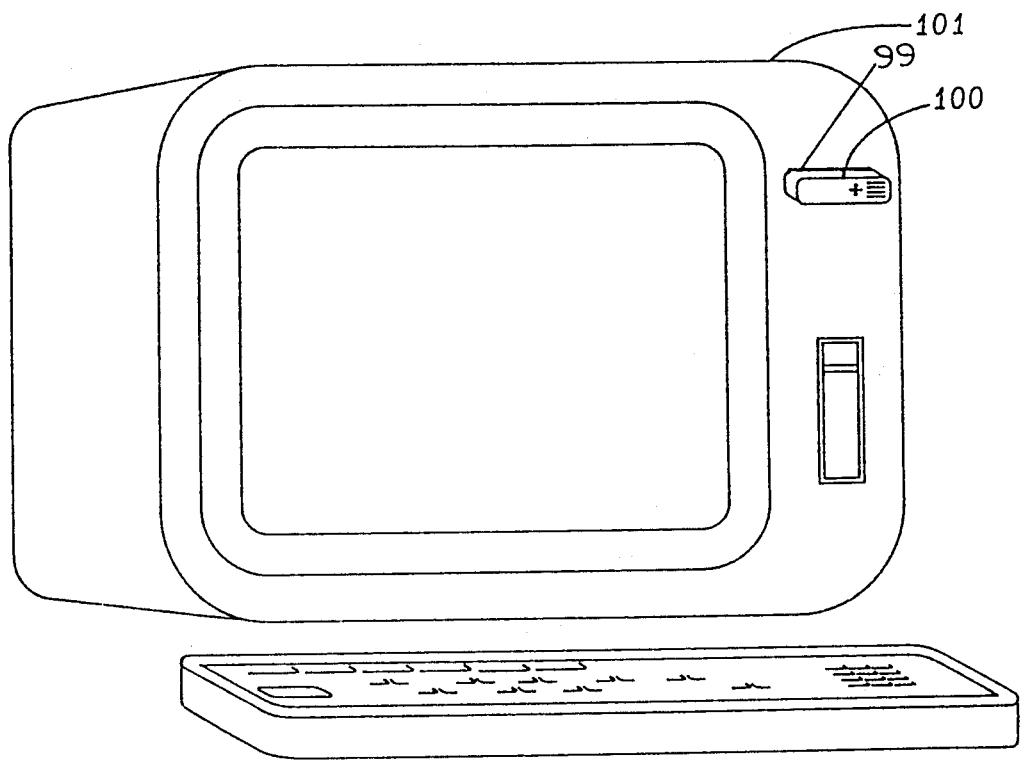
FIG. 1 is a perspective view of a miniaturized Video Display terminal (VDT) Magnetic Field Detector affixed to a video display terminal.
Figure 1A:
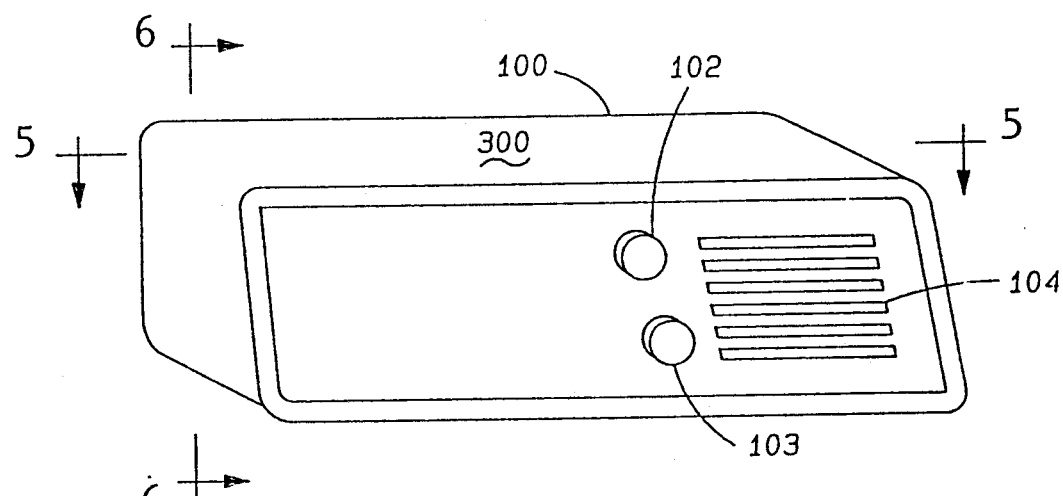
FIG. 1A depicts the flag indicator, test light and grille on the casing of VDT Magnetic Field Detector.

Referring now to the drawings wherein like reference numerals are used to reference identical components in various views, FIG. 1 depicts VDT Magnetic Field Detector 100 of the present invention affixed to the casing of video display terminal (VDT) 101 by conventional means such as double sided tape 99. FIG. 1A depicts the casing of VDT Magnetic Field Detector 100 including flag indicator 102, test light 103, and grille 104.

Figure 2:
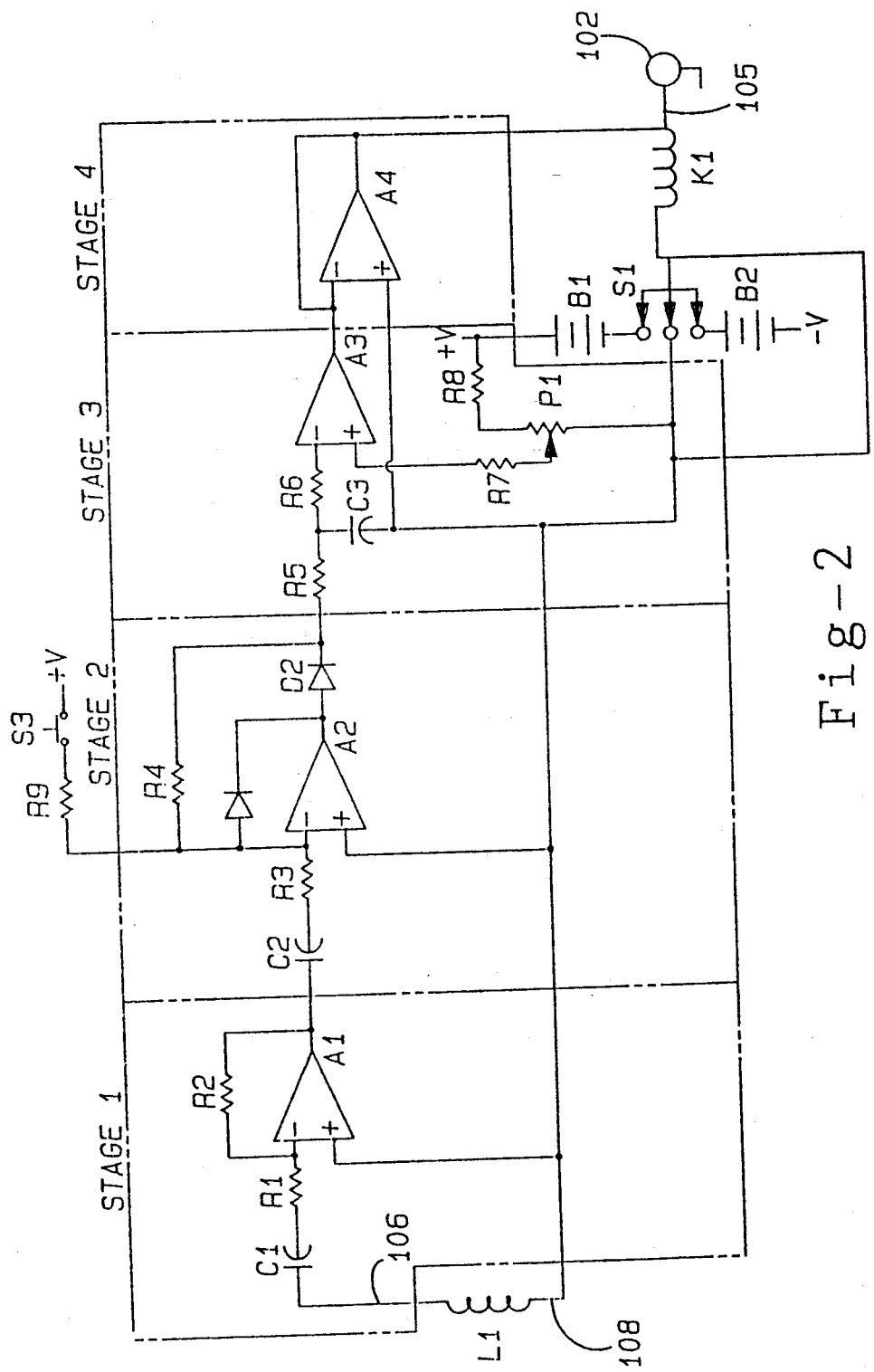
FIG. 2 is a schematic circuit diagram of the VDT Magnetic Field Detector of the present invention utilizing a pickup coil as a magnetic field sensor.

FIG. 2 is a schematic circuit diagram of VDT Magnetic Field Detector 100 of the present invention utilizing pickup coil L1 as a magnetic field sensor. A magnetic field emanating from VDT 101 passes unaffected through grille 104 inducing a current to flow through pickup coil L1 which is connected to stage one of VDT Magnetic Field Detector 100. Pickup coil L1 is preferably a 1" dia., 100 turn winding of 22 gauge wire. Stage one, which functions as a high gain amplifier, includes Operational Amplifier A1, resistors R1 and R2 and capacitor C1. Preferably the value of R1 is 10 ohms and the value of R2 is 1M ohms yielding a gain factor of 100,000 according to the basic amplification factor equation for an ideal inverting amplifier (feedback resistance/input resistance). Utilizing single capacitor C1 in series with pickup coil L1 provides a broad band low frequency response curve. The value preferred by the inventor for capacitor C1 is 0.1 μF. The values chosen for pickup coil L1 and capacitor C1 enable VDT Magnetic Field Detector 100 to measure magnetic field radiation in both the extremely low frequency (ELF, 5 to 2K Hz.) and very low frequency (VLF, 2K to 400K Hz.) ranges.

Stage two, a precision rectifier connected to stage one, includes operational amplifier A2, input resistor R3, feedback resistor R4, capacitor C2, and diodes D1 and D2. Stage two produces DC current from the AC signal induced in pickup coil L1 as a result of the time varying magnetic field emitted from VDT 101. A precision rectifier is used because the signal or current induced in pickup coil L1 is quite small even after amplification by a factor of 100,000 by operational amplifier A1. Because individual diodes are manufactured within a range of allowable input voltages to forward bias the device, if conventional diodes were used without supporting operational amplifier A2, the extremely small signal output from stage one would likely fall within the input voltage tolerance or range of allowable values. The induced signal would become indistinguishable from the operational input voltage variance of diodes D1 and D2. Functional test switch S3 provides a battery power test capability to reassure the user that batteries B1, B2 are energized and that the circuit is not shorted. The stage two component values preferred by the inventor are: input resistor R3=10K ohms, feedback resistor R4=100K, resistor R9=100K, and capacitor C2=0.001 μF.

Stage three, a comparator connected to the output of operational amplifier A2 and batteries B1 and B2, includes operational amplifier A3, input resistors R5, R6, R7, and R8, and potentiometer P1. Potentiometer P1 provides flexibility in setting a threshold input voltage at which to trigger output from comparator operational amplifier A3. Capacitor C3 is charged by the DC output of operational amplifier A2. Connecting capacitor C3 across the input of operational amplifier A3 results in a decrease in input voltage variation and the ripple effect in the current produced by the precision rectification of stage two. Stage three components values preferred by the inventor are: input resistors R5=100K, R6=100K, R7=100K, and R8=100K.

Stage four is comprised of a driver in the form of operational amplifier A4. The output of operational amplifier A4 is connected to solenoid/relay K1. Operational amplifier A4 is used in an inverting configuration preferably with a gain of one (0 feedback resistance/0 input resistance). This stage acts merely as a buffer which tends to isolate relay K1 from any harmful output characteristics of operational amplifier A3. Using operational amplifier A4 as a driver also improves power delivery or transfer to relay K1. Operational amplifiers are typically packaged in groups of four. The design of the present invention is cost effective in that it utilizes all four amplifiers in this component.

Relay K1 is powered by batteries B1, B2 and triggered by the output of operational amplifier A4. Integral with relay K1 is tri-switch S1 which functions as a solenoid to break electrical contact between relay K1 and batteries B1, B2 when flag indicator 102 has been actuated. Before a threshold magnetic field is sensed in pickup coil L1, very little current flows in the entire circuit. Once a current sufficient to trigger operational amplifier A3 has been induced in pickup coil L1, a relatively larger amount of current will begin to flow through K1. If the higher current level is sustained for some time, batteries B1 and B2 will discharge. Therefore, relay K1 and tri-switch S1 have been designed such that when relay K1 is energized, core 105 of the relay K1 is pulled toward the center of relay K1. Attached to core 105 is flag indicator 102 and tri-switch S1. Movement of core 105 activates flag indicator 102 and simultaneously causes tri-switch S1 to disconnect batteries B1 and B2 from the circuit. No additional power is required to maintain flag indicator 102 in its actuated position. Flag indicator 102 may be reset manually. Because the circuit draws no additional power until relay K1 is reset, energy stored in batteries B1, B2 is conserved. Thus, constructing relay K1 integral with tri-switch S1 conserves energy stored in batteries B1, B2. Relay K1 is a unique improvement over conventional relays and is not available as a standard component.

Figure 3:
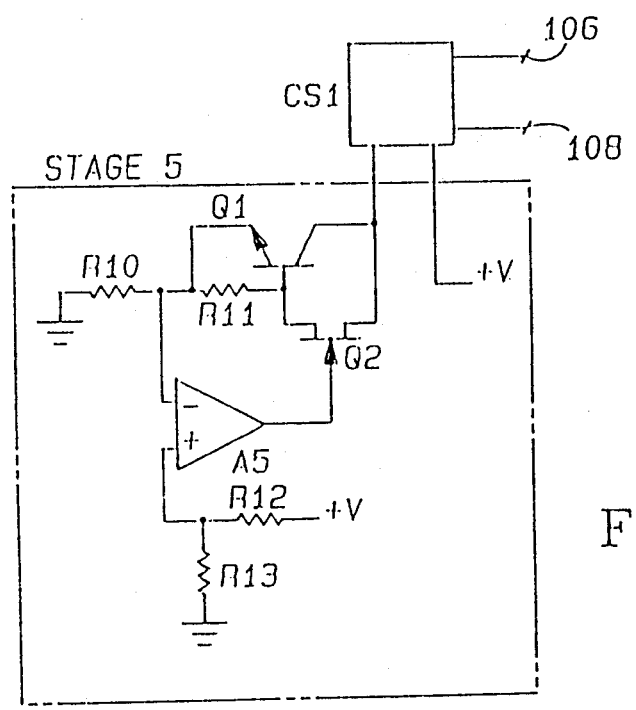
FIG. 3 is a schematic of an alternative embodiment of the VDT Magnetic Field Detector utilizing a Hall effect current sensor as a magnetic field sensor.

An alternative embodiment of the present invention depicted in FIG. 3 replaces pick up coil L1 with Hall effect current sensor CS1 as the magnetic field sensing element. A Hall effect current sensor outputs voltage proportional to a magnetic field provided that a constant current is properly applied. The design for a constant current source preferred by the inventor is shown as stage five. Stage five is comprised of operational amplifier A5, NPN transistor Q1, field-effect transistor Q2, and resistors R10, R11, R12, and R13. Stage five, functioning as a constant current source for Hall effect current sensor CS1, is connected directly in place of L1 in FIG. 2 at connection points 106 and 108. Stage five can be modeled as a Norton equivalent constant current source producing a current $I_{out}$ 110, preferably 20 mA. Preferred transistor model numbers are: Q1=2N2219, Q2 2N4867, while the preferred Hall effect current sensor model number is: CS1=F. W. Bell FH 301 which has a magnetic field sensitivity of 12 mV per kiloGauss. Voltage sources preferred are +, −3 V.

Other alternative embodiments could replace flag indicator 102 with either an audio indicator signal, an alternate visual indicator such as an LED or any type of low voltage lamp. All components depicted in the present invention, VDT Magnetic Field Detector 100, are standard (off-the-shelf) components unless expressly mentioned otherwise.

What is claimed is:

1. An apparatus for use in combination with a video display terminal and adapted to provide a warning of a harmful level of a certain magnetic field emanating from said terminal, said apparatus comprising:
   a generally rectangular casing including mounting means for affixing said casing to a surface, said casing being mounted upon the surface of said video display terminal and having a grilled surface through which said certain magnetic field is receivably passed;
   sensing means positioned within said casing for receiving said certain magnetic field and for producing a current only when said field has a frequency of about 5 Hz to about 400,000 Hz;
   amplification means positioned within said casing and electrically coupled to said sensing means for amplifying said current and for outputting the amplified current;
   comparison means, positioned within said casing and electrically coupled to said amplification means, for comparing said amplified current with a predetermined value and for producing a signal only when said amplified current exceeds said predetermined value; and indication means, electrically coupled to said comparison means, for producing an indication when said amplified current exceeds said predetermined value, thereby warning of a harmful level of said certain magnetic field.

* * * * *